(12) United States Patent
Kim et al.

(10) Patent No.: US 10,141,379 B2
(45) Date of Patent: Nov. 27, 2018

(54) ORGANIC LIGHT EMITTING DIODE DISPLAY DEVICE WITH REDUCED REFLECTANCE

(71) Applicant: LG Display Co., Ltd., Seoul (KR)

(72) Inventors: Youngho Kim, Paju-si (KR);
SeungBeum Lee, Goyang-si (KR);
InCheol Park, Paju-si (KR); EunMi Jo, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/368,275

(22) Filed: Dec. 2, 2016

(65) Prior Publication Data
US 2017/0162632 A1    Jun. 8, 2017

(30) Foreign Application Priority Data

Dec. 4, 2015    (KR) .......................... 10-2015-0172211

(51) Int. Cl.
*H01L 29/04*    (2006.01)
*H01L 29/10*    (2006.01)
*H01L 31/00*    (2006.01)
*H01L 27/32*    (2006.01)
*H01L 51/52*    (2006.01)

(52) U.S. Cl.
CPC ........ *H01L 27/3213* (2013.01); *H01L 27/322* (2013.01); *H01L 51/5281* (2013.01); *H01L 51/5284* (2013.01)

(58) Field of Classification Search
CPC .............. H01L 27/3213; H01L 27/322; H01L 51/5281; H01L 51/5284

USPC ..................... 257/40, 59; 315/169.1; 349/43; 345/694
See application file for complete search history.

(56) References Cited

U.S. PATENT DOCUMENTS

| | | | |
|---|---|---|---|
| 2005/0225237 A1* | 10/2005 | Winters | ............... H01L 27/322 313/506 |
| 2006/0197458 A1* | 9/2006 | Winters | ............... G09G 3/3233 315/169.1 |
| 2013/0313530 A1* | 11/2013 | Seo | ................... H01L 29/66969 257/40 |

(Continued)

FOREIGN PATENT DOCUMENTS

KR    10-2014-0088809 A    7/2014
KR    10-2015-0060200 A    6/2015

*Primary Examiner* — Lex Malsawma
*Assistant Examiner* — Eric W Jones
(74) *Attorney, Agent, or Firm* — Birch, Stewart, Kolasch & Birch, LLP

(57) ABSTRACT

An organic light emitting diode display device can include a display panel including a plurality of pixels, at least one pixel among the plurality of pixels including first to fourth sub-pixels defined at intersection regions between gate lines and data lines; and first to third color filter layers corresponding to the first sub-pixel, the third sub-pixel and the fourth sub-pixel, respectively; the second sub-pixel includes: an emission area, and first and second color filter patterns disposed in the second sub-pixel configured to absorb light incident from an outside of the organic light emitting diode display device, the first color filter pattern and a second color filter pattern are different colors; and the first color filter pattern or the second color filter pattern has a first gap between an edge of the first or second color filter pattern and an edge of the emission area.

20 Claims, 10 Drawing Sheets

(56) References Cited

U.S. PATENT DOCUMENTS

| | | | |
|---|---|---|---|
| 2014/0184972 A1* | 7/2014 | Park | G02F 1/133514 |
| | | | 349/43 |
| 2014/0285542 A1* | 9/2014 | Izumi | G09G 3/2003 |
| | | | 345/694 |
| 2015/0029235 A1* | 1/2015 | Sato | G09G 3/3233 |
| | | | 345/690 |
| 2015/0090985 A1* | 4/2015 | Park | H01L 27/3246 |
| | | | 257/40 |
| 2015/0091786 A1* | 4/2015 | Yang | H01L 27/322 |
| | | | 345/80 |

* cited by examiner

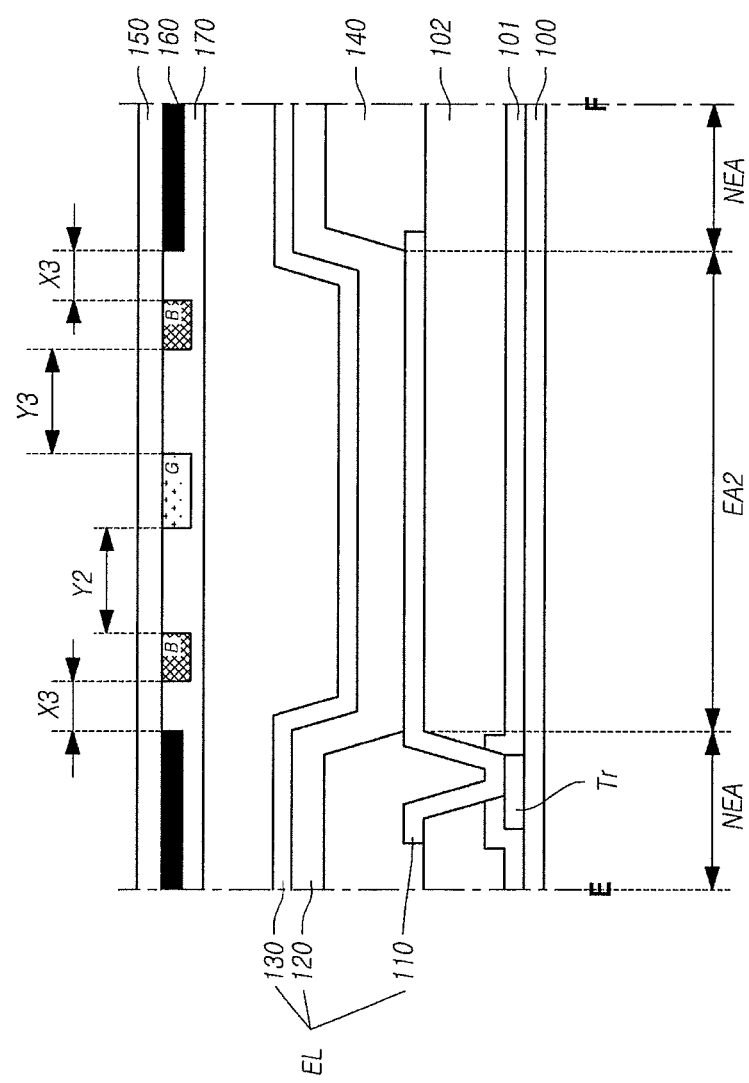

ORGANIC LIGHT EMITTING DIODE DISPLAY DEVICE WITH REDUCED REFLECTANCE

CROSS-REFERENCE TO RELATED APPLICATIONS

This application claims priority from and the benefit under 35 U.S.C. § 119 (a) of Korean Patent Application No. 10-2015-0172211 filed on Dec. 4, 2015, which is hereby incorporated by reference for all purposes as if fully set forth herein.

BACKGROUND OF THE INVENTION

Field of the Invention

The present embodiments relate to an organic light emitting diode display device, and more particularly, to an organic light emitting diode display device capable of reducing the reflectance thereof and realizing a clear black color.

Description of the Related Art

With progress to the information-oriented society, various demands for display devices for displaying an image are increasing. Recently, various kinds of flat panel display devices such as a liquid crystal display (LCD) device, a plasma display panel (PDP) device, and an organic light emitting diode (OLED) display device have been used.

Of the above-described display devices, an OLED display device can be manufactured in a lightweight and thin form since it uses a self-light emitting element and thus does not need a backlight used for a liquid crystal display (LCD) device using a non-emitting element. Further, the OLED display device is excellent in viewing angle and contrast ratio and advantageous in terms of power consumption as compared with the LCD device. In addition, the OLED display device can be driven with a low DC voltage and has a high response speed and includes internal components in the form of solids. Therefore, the OLED display device has the advantages of a high resistance to external shocks, a wide category temperature range, and particularly, low manufacturing costs.

Such an OLED display device displays an image in a top-emission manner or a bottom-emission manner depending on a structure of an organic light emitting element including a first electrode, a second electrode, and an organic light emitting layer. In a bottom-emission OLED display device, a visible light generated from the organic light emitting layer is displayed on a bottom side of a substrate on which a TFT is formed. Further, in a top-emission OLED display device, a visible light generated from the organic light emitting layer is displayed on a top side of the substrate on which the TFT is formed.

Meanwhile, the OLED display device includes a polarizing plate including a circular polarizing plate and a linear polarizing plate, which realizes black for the OLED display device and reduces external light reflection so as to improve visibility. However, using the polarizing plate in the OLED display device is costly and reduces the brightness of the OLED display device.

Therefore, the polarizing plate disposed on or under a display panel is removed and a transmittance control film is applied. However, the reflectance of the display panel is increased and the transmittance of the transmittance control film is decreased, which reduces the light efficiency. Particularly, in an OLED display device including a white (W) sub-pixel, the white (W) sub-pixel without a color filter layer has far higher reflectance than red (R), green (G), and blue (B) sub-pixels, which have a color filter layer. Further, the color filter layers disposed in the red (R), green (G), and blue (B) sub-pixels cause deterioration in visual sensation of a black color in the OLED display device. Accordingly, an OLED display device capable of solving this problem has been demanded.

SUMMARY OF THE INVENTION

Accordingly, the embodied invention is directed to an organic light emitting diode display device capable of reducing the reflectance thereof and realizing a clear black color that substantially obviates one or more problems due to limitations and disadvantages of the related art.

An object of the embodied invention is to provide an organic light emitting diode display device having a display panel including a plurality of pixels, at least one pixel among the plurality of pixels including a first sub-pixel, a second sub-pixel, a third sub-pixel and a fourth sub-pixel defined at intersection regions between a plurality of gate lines and a plurality of data lines; and a first color filter layer, a second color filter layer and a third color filter layer corresponding to the first sub-pixel, the third sub-pixel and the fourth sub-pixel, respectively, in which the second sub-pixel includes: an emission area, and a first color filter pattern disposed in the second sub-pixel for absorbing light incident from an outside of the organic light emitting diode display device, the first color filter pattern and the second sub-pixel correspond to different colors, and the first color filter pattern has a first gap between an edge of the first color filter pattern and an edge of the emission area.

Another object of the embodied invention is to provide a light emitting diode display device having a display panel including a plurality of pixels including at least one white sub-pixel disposed between two other sub-pixels, in which the white sub-pixel includes: an organic light emitting layer disposed between a first electrode and a second electrode, the first electrode connected to a thin film transistor, an emission area defined by a bank pattern, the bank pattern corresponding to a non-emission area, and a color filter pattern disposed in the white sub-pixel for absorbing light incident from an outside of the organic light emitting diode display device, the color filter pattern overlapping with a portion of the emission area, and the color filter pattern has first two sides that extend beyond the emission area and second two sides that terminate over the emission area.

The effects of the embodied invention will be described in detail below.

BRIEF DESCRIPTION OF THE DRAWINGS

The above and other aspects, features and other advantages of the present disclosure will be more clearly understood from the following detailed description taken in conjunction with the accompanying drawings, in which:

FIG. 10 is another cross-sectional view taken along the line E-F of the second sub-pixel in the organic light emitting diode display device according to the third embodiment.

DETAILED DESCRIPTION OF THE PREFERRED EMBODIMENTS

Figure 1:
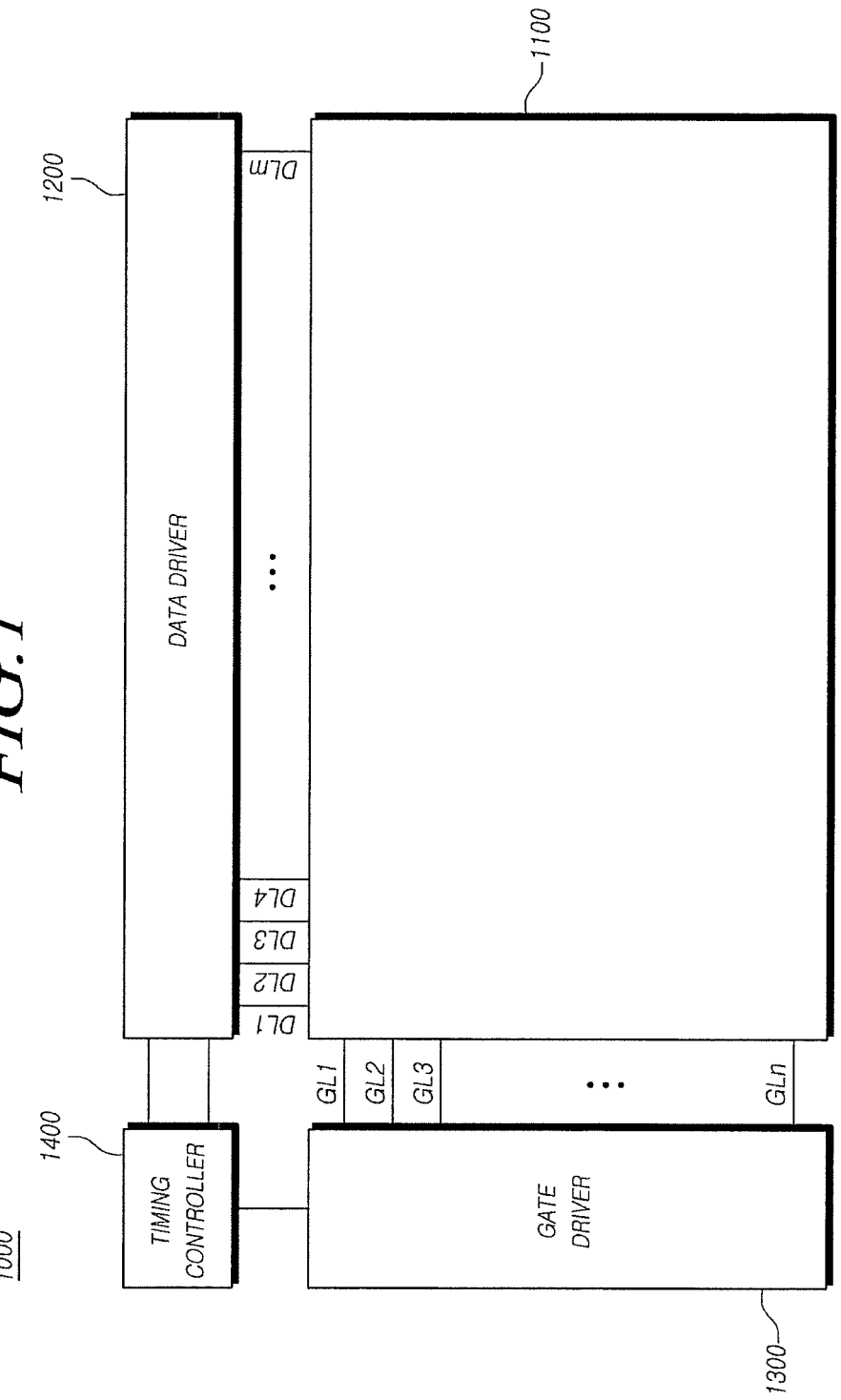
FIG. 1 is a schematic system configuration view of an organic light emitting diode display device according to the present embodiments.

Hereinafter, embodiments of the present disclosure will be described in detail with reference to the accompanying drawings. The following embodiments are provided for sufficiently conveying the concept of the present disclosure to those skilled in the art. Therefore, the present disclosure is not limited to the following embodiments themselves but can be modified and changed in other embodiments. Further, in the drawings, the size and thickness of a device may be exaggerated for convenience. Like reference numerals generally denote like elements throughout the present specification.

Advantages and features of the present disclosure, and methods for accomplishing the same will be more clearly understood from embodiments described below with reference to the accompanying drawings. However, the present disclosure is not limited to the following embodiments but may be implemented in various different forms. The embodiments are provided only to complete disclosure of the present disclosure and to fully provide a person having ordinary skill in the art to which the present disclosure pertains with the category of the invention, and the present disclosure will be defined by the appended claims. Like reference numerals generally denote like elements throughout the present specification. In the drawings, the sizes and relative sizes of layers and regions may be exaggerated for clarity.

When an element or layer is referred to as being "on" another element or layer, it may be directly on the other element or layer, or intervening elements or layers may be present. Meanwhile, when an element is referred to as being "directly on" another element, any intervening elements may not be present.

The spatially-relative terms such as "below", "beneath", "lower", "above", "upper", etc. may be used herein for ease of description to describe the relationship of one element or components with another element(s) or component(s) as illustrated in the drawings. It will be understood that the spatially relative terms are intended to encompass different orientations of the element in use or operation, in addition to the orientation depicted in the drawings. For example, if the element in the drawings is turned over, elements described as "below" or "beneath" other elements would then be oriented "above" the other elements. Thus, the exemplary term "below" can encompass both an orientation of above and below.

Further, in describing components of the present invention, terms such as first, second, A, B, (a), (b), etc., can be used. These terms are used only to differentiate the components from other components. Therefore, the nature, order, sequence, etc., of the corresponding components are not limited by these terms.

FIG. 1 is a schematic system configuration view of an organic light emitting diode display device according to the present embodiments. Referring to FIG. 1, in an organic light emitting diode display device 1000 according to the present embodiments, a plurality of data lines DL to DLm and a plurality of gate lines GL1 to GLn are disposed, and the organic light emitting diode display device 1000 includes a display panel 1100 in which a plurality of sub-pixels is disposed, a data driver 1200 configured to drive the plurality of data lines DL to DLm, a gate driver 1300 configured to drive the plurality of gate lines GL1 to GLn, and a timing controller 1400 configured to control the data driver 1200 and the gate driver 1300.

The data driver 1200 drives the plurality of data lines by supplying a data voltage to the plurality of data lines. Further, the gate driver 1300 sequentially drives the plurality of gate lines by sequentially supplying a scan signal to the plurality of gate lines.

Furthermore, the timing controller 1400 controls the data driver 1200 and the gate driver 1300 by supplying a control signal to the data driver 1200 and the gate driver 1300. The timing controller 1400 starts a scan according to timing implemented in each frame, converts input image data input from the outside to be suitable for a data signal form used by the data driver 1200, outputs the converted image data, and controls a driving of data at a proper time corresponding to the scan.

The gate driver 1300 sequentially drives the plurality of gate lines by sequentially supplying an ON voltage or OFF voltage scan signal to the plurality of gate lines according to the control of the timing controller 1400. Further, the gate driver 1300 may be located at only one side of the display panel 1100 as illustrated in FIG. 1 or may be located at both sides thereof if necessary according to the driving method or the design method of the display panel.

Further, the gate driver 1300 may include one or more gate driver integrated circuits. Each of the gate driver integrated circuits may be connected to a bonding pad of the display panel 1100 through a Tape Automated Bonding (TAB) method or a Chip On Glass (COG) method, or implemented in a Gate In Panel (GIP) type and directly disposed in the display panel 1100, or may be integrated and disposed in the display panel 1100 if necessary.

Otherwise, each of the gate driver integrated circuits may be implemented in a Chip On Film (COF) type. In this instance, a gate driving chip corresponding to each gate driver integrated circuit may be mounted on a flexible film, and one end of the flexible film may be bonded to the display panel 1100.

If a specific gate line is opened, the data driver 1200 converts image data received from the timing controller 1400 into a data voltage in an analog form and supplies the data voltage to the plurality of data lines to drive the plurality of data lines. Further, the data driver 1200 may include at least one source driver integrated circuit to drive the plurality of data lines.

Each source driver integrated circuit may be connected to the bonding pad of the display panel 1100 through a Tape Automated Bonding (TAB) method or a Chip On Glass (COG) method, or directly disposed in the display panel 1100, or may be integrated and disposed in the display panel 1100 if necessary.

Otherwise, each source driver integrated circuit may be implemented in a Chip On Film (COF) type. In this instance, a source driving chip corresponding to each source driver integrated circuit may be mounted on a flexible film, and one end of the flexible film may be bonded to at least one source printed circuit board and the other end thereof may be bonded to the display panel 1100.

The source printed circuit board may be connected to a control printed circuit board through a connector such as a flexible flat cable (FFC) or a flexible printed circuit (FPC). The timing controller 1400 is disposed in the control printed circuit board.

Further, in the control printed circuit board, a power controller configured to supply a voltage or current to the display panel 1100, the data driver 1200, and the gate driver 1300 or control a voltage or current to be supplied may be further disposed. The above-described source printed circuit board and control printed circuit board may be formed as one printed circuit board.

Meanwhile, in the following embodiments, a pixel includes one or more sub-pixels. For example, one pixel may include two or four sub-pixels. Colors defined in the sub-pixels may selectively include red (R), green (G), blue (B), and white (W), but the present embodiments are not limited thereto. However, for convenience in explanation, the display device according to the present embodiments will be described as having a configuration in which one pixel includes four sub-pixels and the sub-pixels are red (R), white (W), green (G), and blue (B) sub-pixels, respectively.

Figure 2:
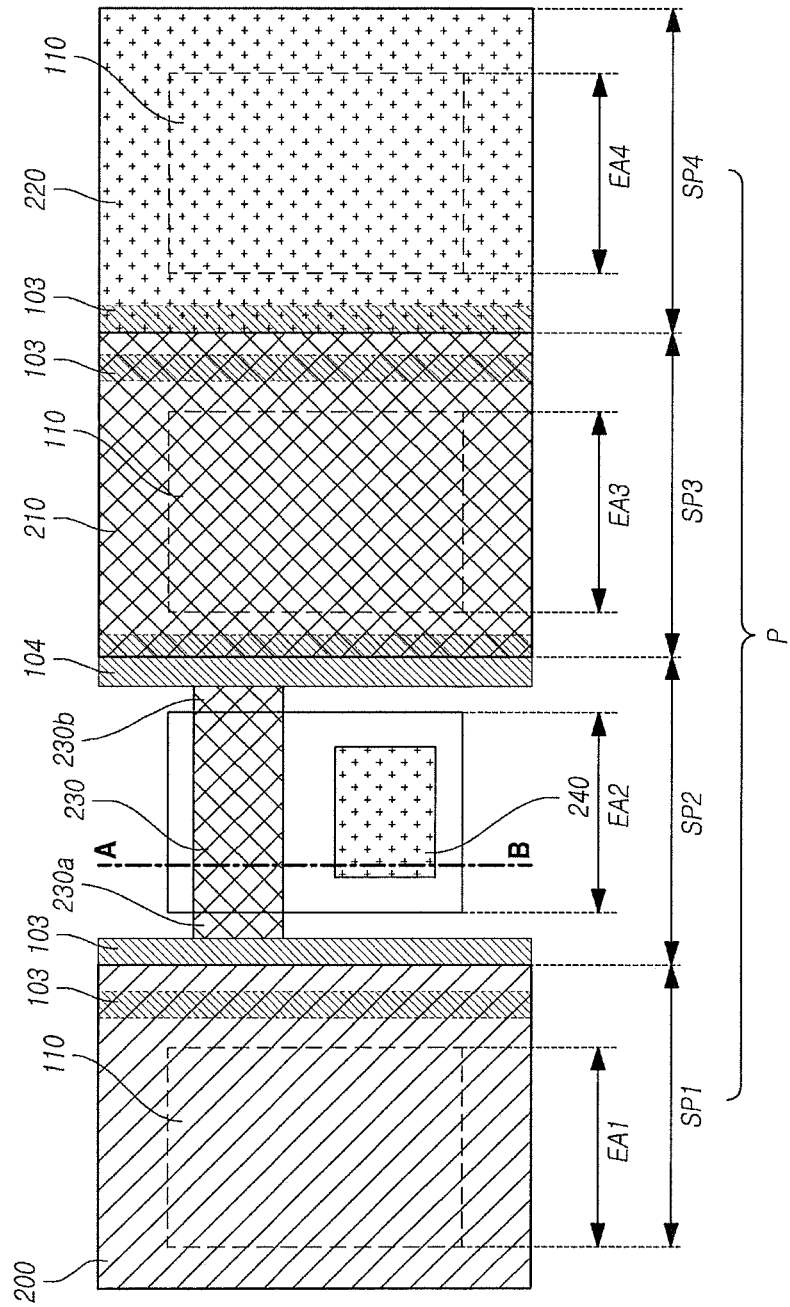
FIG. 2 is a plane view of an organic light emitting diode display device according to a first embodiment.
Figure 3:
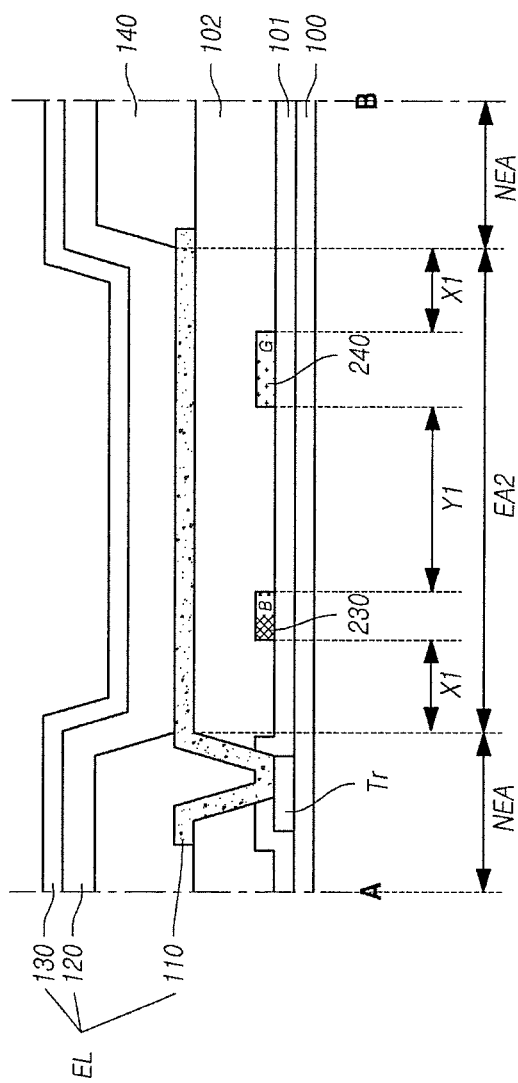
FIG. 3 is a cross-sectional view taken along a line A-B of a second sub-pixel in the organic light emitting diode display device according to the first embodiment.
Figure 4:
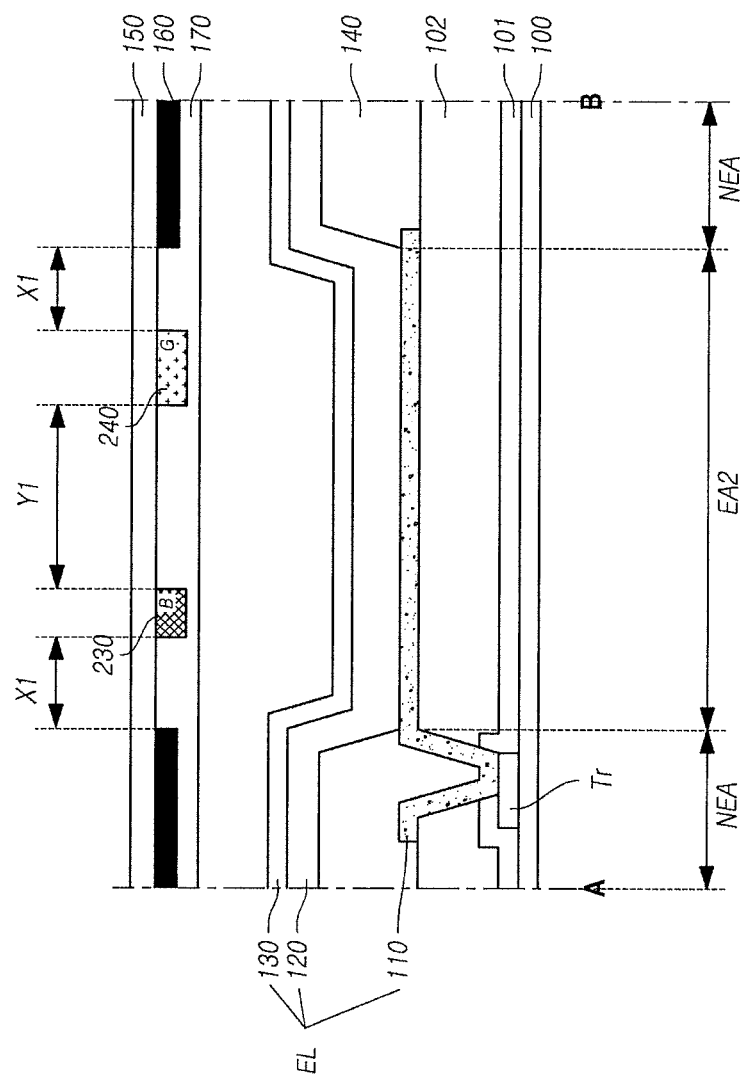
FIG. 4 is another cross-sectional view taken along the line A-B of the second sub-pixel in the organic light emitting diode display device according to the first embodiment.

Referring to FIG. 2 to FIG. 4, an organic light emitting diode display device according to a first embodiment will be described below. FIG. 2 is a plane view of the organic light emitting diode display device according to the first embodiment.

Referring to FIG. 2, a pixel P of the organic light emitting diode display device according to the first embodiment includes four sub-pixels SP1, SP2, SP3, and SP4. To be specific, the one pixel P includes a first sub-pixel SP1, a second sub-pixel SP2, a third sub-pixel SP3, and a fourth sub-pixel SP4.

Each of the sub-pixels SP1, SP2, SP3, and SP4 may be defined as an intersection region between a gate line disposed in a horizontal direction and a data line 103 disposed in a vertical direction so as to intersect with the gate line. Meanwhile, on one side of the data line 103, a reference voltage line 104 may be disposed in parallel with the data line 103.

Meanwhile, the first sub-pixel SP1 may be a red (R) sub-pixel, the second sub-pixel SP2 may be a white (W) sub-pixel, the third sub-pixel SP3 may be a green (G) sub-pixel, and the fourth sub-pixel SP4 may be a blue (B) sub-pixel. However, the array of the first to fourth sub-pixels SP1, SP2, SP3, and SP4 of the organic light emitting diode display device according to the first embodiment is not limited to FIG. 2.

The first to fourth sub-pixels SP1, SP2, SP3, and SP4 include a first emission area EA1, a second emission area EA2, a third emission area EA3, and a fourth emission area EA4, respectively. Herein, the first to fourth emission areas EA1, EA2, EA3, and EA4 may be defined by a bank pattern disposed on a part of a top surface of a first electrode 110 of an organic light emitting diode.

Further, a first color filter layer 200, a second color filter layer 210, and a third color filter layer 220 may be respectively disposed at regions corresponding to the first sub-pixel SP1, the third sub-pixel SP3, and the fourth sub-pixel SP4. Herein, the first color filter layer 200 may be a red color filter layer, the second color filter layer 210 may be a green color filter layer, and the third color filter layer 220 may be a blue color filter layer.

Meanwhile, a polarizing plate may be provided on or under the display panel depending on an emission method of an organic light emitting display panel. The polarizing plate may include a linear polarizing plate and a circular polarizing plate, which reduces external light reflection so as to improve visibility of the organic light emitting diode display device. However, the polarizing plate is expensive and causes a decrease in brightness of the organic light emitting diode display device.

If the polarizing plate is not disposed on or under the organic light emitting display panel, the reflectance may be increased. However, the first color filter layer 200, the second color filter layer 210, and the third color filter layer 220 respectively disposed at the regions corresponding to the first sub-pixel SP1, the third sub-pixel SP3, and the fourth sub-pixel SP4 absorb external light, and, thus, the reflectance of the first sub-pixel SP1, the third sub-pixel SP3, and the fourth sub-pixel SP4 may be decreased.

However, due to external light reflection occurring at the second sub-pixel SP2, the overall reflectance of the organic light emitting diode display device may be increased. Meanwhile, in order to solve this problem, in the organic light emitting diode display device according to the first embodiment, a first color filter pattern 230 and a second color filter pattern 240 may be disposed corresponding to the second sub-pixel SP2.

That is, the first color filter pattern 230 and the second color filter pattern 240 are disposed in the second sub-pixel SP2, and, thus, the external light reflectance of the organic light emitting diode display device can be reduced. In other words, the first color filter pattern 230 and the second color filter pattern 240 disposed in the second sub-pixel SP2 absorb light incident from the outside of the display device, and, thus, a decrease in visibility caused by external light can be improved.

Meanwhile, in the organic light emitting diode display device without the polarizing plate, the first color filter layer 200, the second color filter layer 210, and the third color filter layer 220 are respectively disposed at the regions corresponding to the first sub-pixel SP1, the third sub-pixel SP3, and the fourth sub-pixel SP4 and the first color filter pattern 230 and the second color filter pattern 240 are disposed in the second sub-pixel SP2, and, thus, there may be a problem in realizing a black color.

To be specific, when the organic light emitting diode display device realizes a black color, another color other than black color can be seen. For example, a color of the color filter layer may be seen.

In order to solve this problem, the display device according to the first embodiment, the first color filter pattern 230 disposed corresponding to the second sub-pixel SP2 may be a blue color filter pattern and the second color filter pattern 240 may be a green color filter pattern. Accordingly, by improving reflection sensation when the organic light emitting diode display device is in a black state, a viewer can sense a clear black color. To be specific, if a color filter pattern is not disposed in the second sub-pixel SP2, when the organic light emitting diode display device is in a black state, a color of a color filter disposed in another sub-pixel can be seen. Thus, a clear black color cannot be sensed. Meanwhile, in the display device according to the first embodiment, the first color filter pattern 230 and the second color filter pattern 240 in the second sub-pixel SP2 absorb unnecessary light. Thus, reflection sensation can be improved.

Herein, the first color filter pattern 230 may account for 10% to 30% of the second sub-pixel SP2. Further, the second color filter pattern 240 may account for 10% to 30% of the second sub-pixel SP2.

Meanwhile, if the first and second color filter patterns 230 and 240 cannot secure an overlay margin, the sizes or locations of the first and second color filter patterns 230 and 240 may deviate in location due to a process variation (for example, a location of a mask or an exposure amount). That is, if each of the first and second color filter patterns 230 and 240 is disposed to account for 30% or more of the second sub-pixel SP2, the sizes or locations of the first and second color filter patterns 230 and 240 may deviate, which may make it difficult to reduce reflection sensation.

To be specific, if the first and second color filter patterns 230 and 240 have small sizes or are not formed at desired locations, it is impossible to move to black coordinates as a target from black coordinates in the organic light emitting diode display device in which the first and second color filter patterns 230 and 240 are not disposed. Thus, a clear black color cannot be realized.

Meanwhile, if the emission area EA2 of the second sub-pixel SP2 is narrow, the first and second color filter patterns 230 and 240 may have a gap (hereinafter, referred to as "first gap") at a boundary between at least one lateral surface of each of the first and second color filter patterns 230 and 240 and the second emission area EA2 in order to secure an overlay margin. Otherwise, the first and second color filter patterns 230 and 240 may have a gap (hereinafter, referred to as "second gap") between at least one lateral surface of each of the first and second color filter patterns 230 and 240 and the data line 103 or the reference voltage line 104 disposed in parallel with the data line 103.

Herein, additional patterns 230a and 230b extended from the first and second color filter patterns 230 and 240 may be provided on the first gap or the second gap. For example, as illustrated in FIG. 2, the first additional pattern 230a may be provided between the first color filter pattern 230 and the data line 103. Further, the second additional pattern 230b may be provided between the first color filter pattern 230 and the reference voltage line 104.

Since the first color filter pattern 230 includes the first additional pattern 230a and the second additional pattern 230b, even if the first color filter pattern 230 is formed to have a small size due to a large exposure amount or deviation of a mask location, the first color filter pattern 230 may account for 10% to 30% of the second sub-pixel SP2.

FIG. 2 illustrates a configuration in which the first and second additional patterns 230a and 230b are disposed outside the second emission area EA2, but the organic light emitting diode display device according to the first embodiment is not limited thereto. The first and second additional patterns 230a and 230b may be disposed inside the second emission area EA2.

Meanwhile, a width of the first gap and the second gap may be at least 9 μm. Herein, since the first gap and the second gap have a width of at least 9 μm, additional patterns extended from the first color filter pattern 230 and the second color filter pattern 240 may be formed.

Further, the first color filter pattern 230 and the second color filter pattern 240 are disposed in parallel with the gate line within the second sub-pixel SP2 so as to be separate from each other. Accordingly, it is possible to secure an overlay margin at four lateral surfaces of the first color filter pattern 230 and the second color filter pattern 240.

Herein, a gap, i.e. a distance in a direction of the data line, between the first color filter pattern 230 and the second color filter pattern 240 may be at least 18 μm. Accordingly, an overlay margin of each of the first color filter pattern 230 and the second color filter pattern 240 can be secured.

Further, FIG. 2 illustrates a configuration in which the first color filter pattern 230 includes the first additional pattern 230a and the second additional pattern 230b on the first and the second gap, respectively, but the organic light emitting diode display device according to the first embodiment is not limited thereto and may also include a configuration in which the first color filter pattern 230 does not include the first and second additional patterns 230a and 230b. To be specific, if the emission area EA2 of the second sub-pixel SP2 is large enough, the first color filter pattern 230 may not include an additional pattern.

Meanwhile, an area of the first color filter pattern 230 may be greater than an area of the second color filter pattern 240. Accordingly, it is possible to realize the black coordinates as a target.

The above-described configuration of the second sub-pixel SP2 will be described in detail with reference to FIG. 3 and FIG. 4. FIG. 3 is a cross-sectional view taken along a line A-B of a second sub-pixel in the organic light emitting diode display device according to the first embodiment. FIG. 4 is another cross-sectional view taken along the line A-B of the second sub-pixel in the organic light emitting diode display device according to the first embodiment.

Referring to FIG. 3, a thin film transistor Tr is disposed on a substrate 100. A protective layer 101 and an overcoating layer 102 may be disposed on the thin film transistor Tr. Further, a first electrode 110 of an organic light emitting diode EL may be disposed on the overcoating layer 102. A drain electrode of the thin film transistor Tr may be connected to the first electrode 110 of the organic light emitting diode EL. Herein, the first electrode 110 may be formed of a transparent conductive material.

A bank pattern 140 that defines an emission area EA and a non-emission area NEA is disposed on a part of a top surface of the first electrode 110. Further, an organic light emitting layer 120 is disposed on the first electrode 110 and the bank pattern 140. FIG. 3 illustrates a configuration in which the organic light emitting layer 120 is disposed on the first electrode 110 and the bank pattern 140, but the organic light emitting diode display device according to the first embodiment is not limited thereto and may include a configuration in which the organic light emitting layer 120 is disposed only on the first electrode 110.

A second electrode 130 is disposed on the organic light emitting layer 120. Herein, the second electrode 130 may be a reflective electrode. Therefore, it is possible to implement a bottom-emission organic light emitting diode display device.

If the organic light emitting diode display device according to the first embodiment is a bottom-emission organic light emitting diode display device, the first color filter pattern 230 and the second color filter pattern 240 may be disposed between the protective layer 101 and the overcoating layer 102 in a region corresponding to the emission area EA2.

Herein, the first color filter pattern 230 and the second color filter pattern 240 may be disposed to be separate from each other within the emission area EA2. Further, the first color filter pattern 230 and the second color filter pattern 240 may be disposed to be separate from the region where the bank pattern 140 is disposed.

That is, the first color filter pattern 230 may secure an overlay margin equivalent to a gap X1 between the bank pattern 140 and the first color filter pattern 230 and a gap Y1 between the first color filter pattern 230 and the second color filter pattern 240. Further, the second color filter pattern 240 may secure an overlay margin equivalent to the gap X1 between the bank pattern 140 and the second color filter pattern 240 and the gap Y1 between the first color filter pattern 230 and the second color filter pattern 240.

A transmittance control film may be disposed on a back surface of the substrate 100. The transmittance control film can reduce the reflectance of the organic light emitting display panel. However, as the reflectance of the panel increases, the function of the transmittance control film may decrease. To be specific, when the reflectance of the panel increases, it is hard to expect an effect of reducing the reflectance of the panel through the transmittance control film.

However, in the organic light emitting diode display device according to the first embodiment, the first color filter pattern 230 and the second color filter pattern 240 are disposed in the second sub-pixel. Therefore, the reflectance of the panel is decreased, and, thus, the transmittance of the transmittance control film can be increased. Accordingly, it is possible to reduce a current flowing in the panel or improve the brightness at the same current.

Further, FIG. 4 illustrates a cross-sectional view in the case where the organic light emitting diode display device according to the first embodiment is a top-emission organic light emitting diode display device. Referring to FIG. 4, the thin film transistor Tr, the protective layer 101, and the overcoating layer 102 are disposed on the first substrate 100.

The organic light emitting diode EL and the bank pattern 140 are disposed on the overcoating layer 102. Herein, the first electrode 110 of the organic light emitting diode EL may be a reflective electrode, and the second electrode 130 may be formed of a transparent conductive material. Therefore, it is possible to implement a top-emission organic light emitting diode display device.

Further, a second substrate 200 is disposed to face the first substrate 100. A black matrix 160, the first color filter pattern 230, the second color filter pattern 240, and the overcoating layer 170 are disposed on one surface of the second substrate 200. Herein, the first color filter pattern 230 and the second color filter pattern 240 are disposed corresponding to the emission area EA2. Furthermore, the black matrix 160 is disposed in a region corresponding to the region where the bank pattern 140 is disposed.

The first color filter pattern 230 may secure an overlay margin equivalent to the gap X1 between the black matrix 160 and the first color filter pattern 230 and the gap Y1 between the first color filter pattern 230 and the second color filter pattern 240. Further, the second color filter pattern 240 may secure an overlay margin equivalent to the gap X1 between the black matrix 160 and the second color filter pattern 240 and the gap Y1 between the first color filter pattern 230 and the second color filter pattern 240.

Accordingly, in the bottom-emission and top-emission organic light emitting diode display devices without the polarizing plate, it is possible to improve the reflection sensation while reducing the reflectance.

Then, referring to FIGS. 5 to 7, an organic light emitting diode display device according to a second embodiment will be described below. The organic light emitting display device according to the second embodiment may include the same components as those of the above-described embodiment. The redundant description thereof may be omitted herein. Further, like components are assigned like reference numerals.

Figure 5:
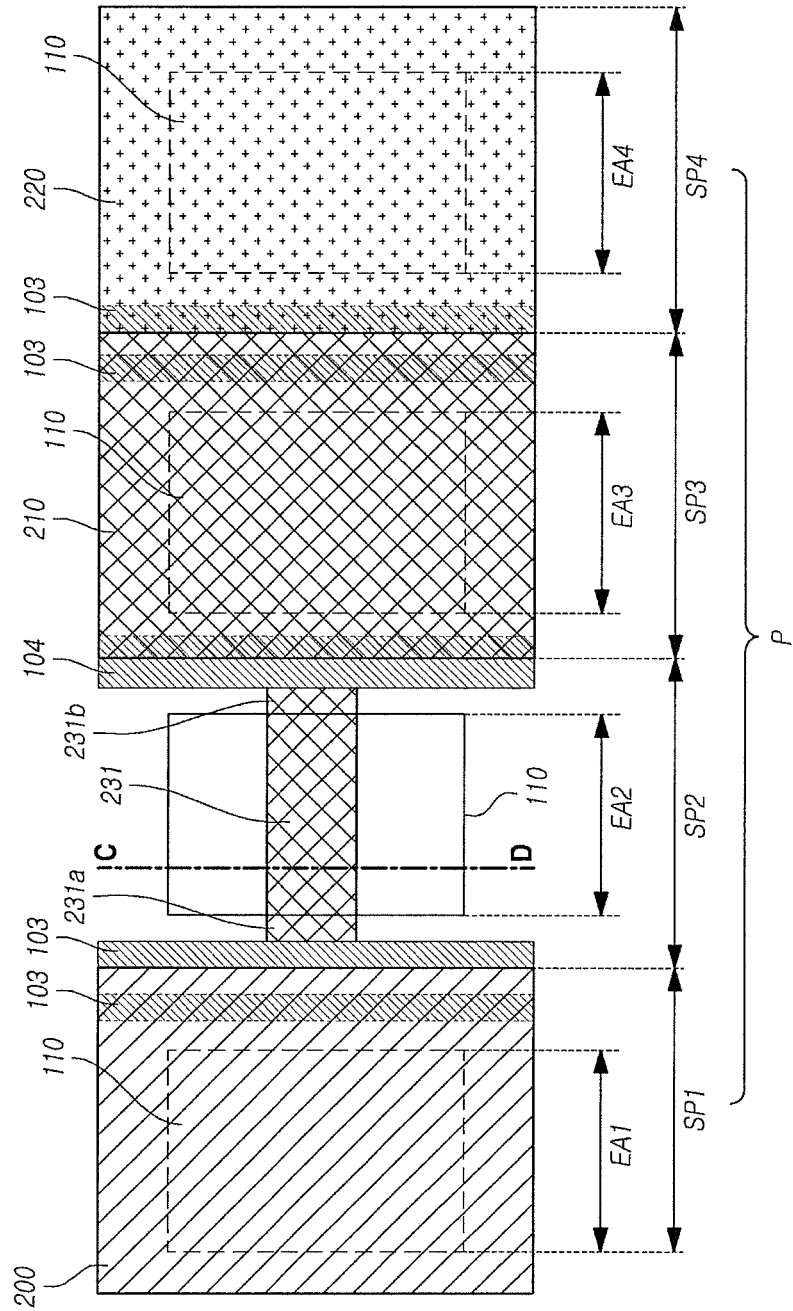
FIG. 5 is a plane view of an organic light emitting diode display device according to a second embodiment.

FIG. 5 is a plane view of the organic light emitting diode display device according to the second embodiment. FIG. 6 is a cross-sectional view taken along a line C-D of a second sub-pixel in the organic light emitting diode display device according to the second embodiment. FIG. 7 is another cross-sectional view taken along the line C-D of the second sub-pixel in the organic light emitting diode display device according to the second embodiment.

Figure 6:
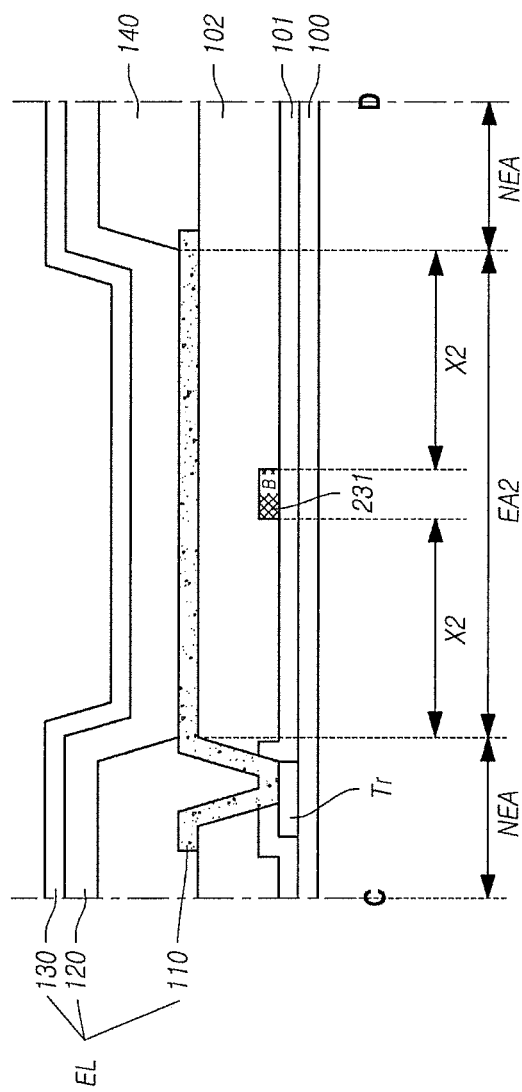
FIG. 6 is a cross-sectional view taken along a line C-D of a second sub-pixel in the organic light emitting diode display device according to the second embodiment.
Figure 7:
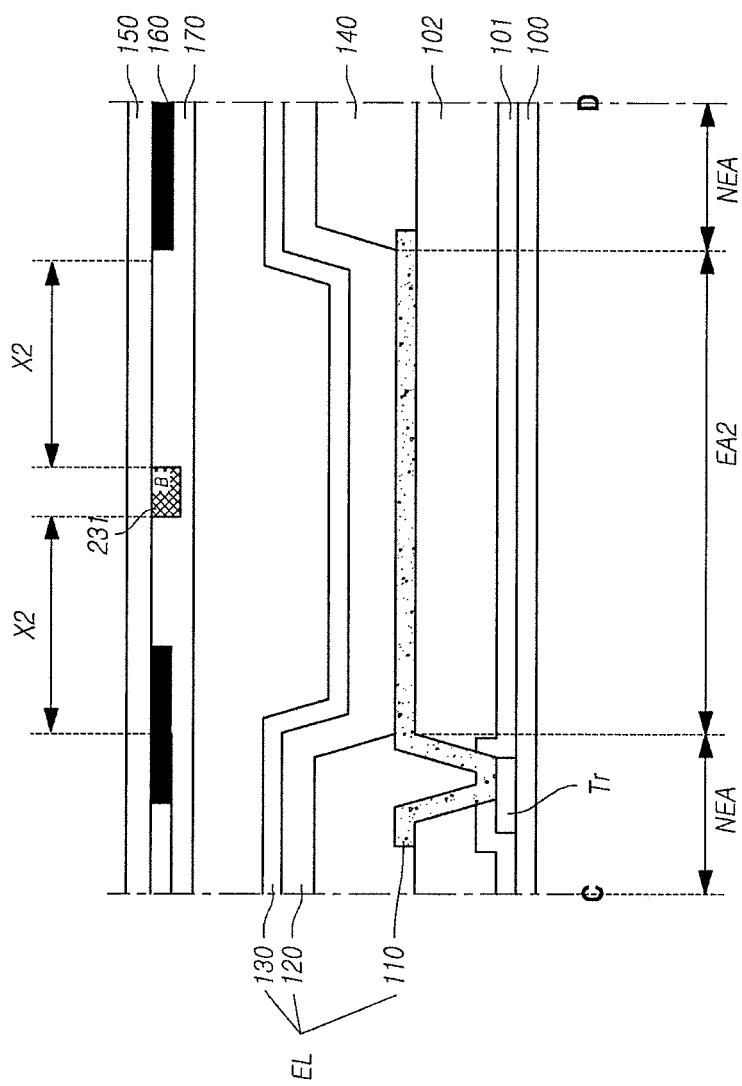
FIG. 7 is another cross-sectional view taken along the line C-D of the second sub-pixel in the organic light emitting diode display device according to the second embodiment.

Referring to FIG. 5 to FIG. 7, the organic light emitting diode display device according to the second embodiment may include a color filter pattern 231 in the second sub-pixel SP2. Herein, the color filter pattern 231 may be a blue color filter pattern.

Herein, in order to secure an overlay margin of the color filter pattern 231, at least one surface may have a gap at a boundary with the emission area EA2 or may have a gap between at least one lateral surface of the color filter pattern 231 and the data line 103 disposed on the substrate 100 or the reference voltage line 104 disposed in parallel with the data line 103.

Accordingly, an additional pattern extended from the color filter pattern 231 may be provided. Thus, even if the first color filter pattern 230 is formed to have a small size due to a large exposure amount or deviation of a mask location or deviates in location, the color filter pattern 231 having a desired shape or desired area can be formed.

Meanwhile, as illustrated in FIG. 6 and FIG. 7, the color filter pattern 231 may secure an overlay margin equivalent to a gap X2 between the bank pattern 140 or the black matrix 160 and the color filter pattern 231. Herein, the color filter pattern 231 may have the gap X2 of at least 9 µm between the bank pattern 140 or the black matrix 160 and the color filter pattern 231. Accordingly, it is possible to secure an overlay margin of the color filter pattern 231.

Then, referring to FIG. 8 to FIG. 10, an organic light emitting diode display device according to a third embodiment will be described below. The organic light emitting display device according to the third embodiment may include the same components as those of the above-described embodiments. The redundant description thereof may be omitted herein. Further, like components are assigned like reference numerals.

Figure 8:
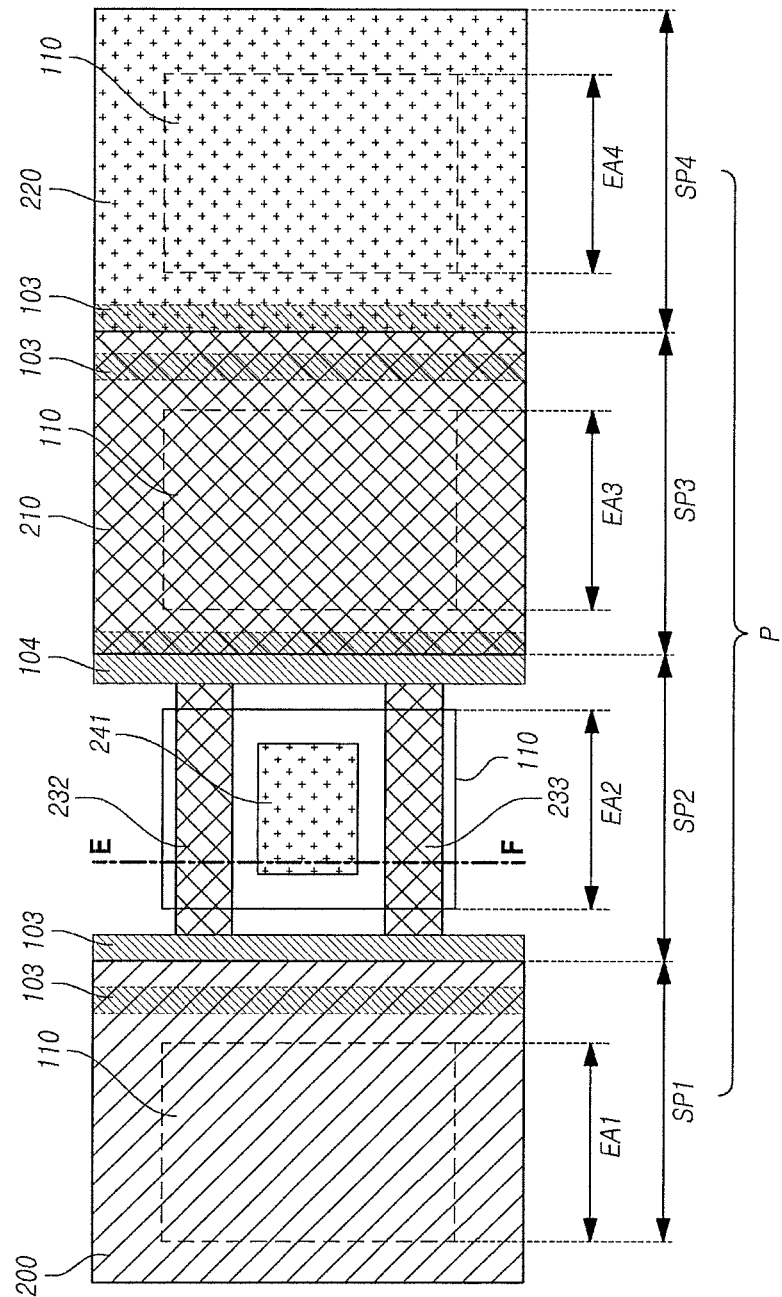
FIG. 8 is a plane view of an organic light emitting diode display device according to a third embodiment.

FIG. 8 is a plane view of the organic light emitting diode display device according to the third embodiment. FIG. 9 is a cross-sectional view taken along a line E-F of a second sub-pixel in the organic light emitting diode display device according to the third embodiment. FIG. 10 is another cross-sectional view taken along the line E-F of the second sub-pixel in the organic light emitting diode display device according to the third embodiment.

Figure 9:
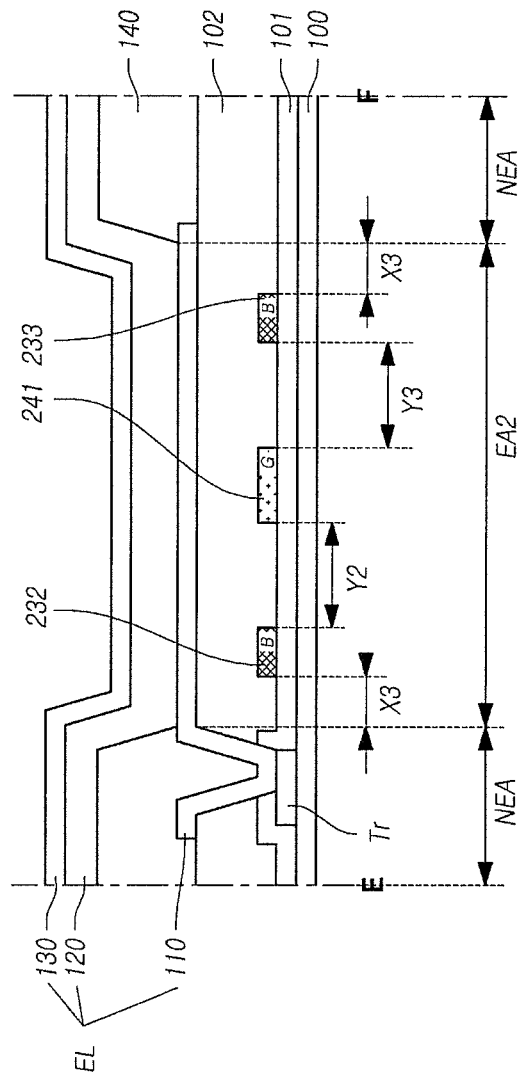
FIG. 9 is a cross-sectional view taken along a line E-F of a second sub-pixel in the organic light emitting diode display device according to the third embodiment.

Referring to FIG. 8 to FIG. 10, the organic light emitting diode display device according to the third embodiment may include three color filter patterns in the second sub-pixel SP2. To be specific, the second sub-pixel SP2 may include a first color filter pattern 232, a second color filter pattern 241, and a third color filter pattern 233.

Herein, the first color filter pattern 232 and the third color filter pattern 233 may be blue color filter patterns, and the second color filter pattern 241 may be a green color filter pattern. FIG. 8 illustrates a configuration in which the first color filter pattern 232, the second color filter pattern 241, and the third color filter pattern 233 are disposed sequentially in a direction parallel with the data line, but the organic light emitting diode display device according to the third embodiment is not limited to the sequence of the first to third color filter patterns 232, 241, and 233.

In order to secure an overlay margin of the first to third color filter patterns 232, 241, and 233, at least one surface of each of the first to third color filter patterns 232, 241, and 233 may have a gap at a boundary with the emission area EA2 or may have a gap between at least one lateral surface of the color filter pattern 231 and the data line 103 disposed on the substrate 100 or the reference voltage line 104 disposed in parallel with the data line 103.

Meanwhile, as illustrated in FIG. 9 and FIG. 10, the first color filter pattern 232 may secure an overlay margin equivalent to a gap X3 between the bank pattern 140 or the black matrix 160 and the first color filter pattern 232 and a gap Y2 between the first color filter pattern 232 and the second color filter pattern 241.

Further, the second color filter pattern 241 may secure an overlay margin equivalent to the gap Y2 between the first color filter pattern 232 and the second color filter pattern 241 and a gap Y3 between the second color filter pattern 241 and the third color filter pattern 233.

Furthermore, the third color filter pattern 233 may secure an overlay margin equivalent to the gap X3 between the bank pattern 140 or the black matrix 160 and the third color filter pattern 233 and the gap Y2 between the third color filter pattern 233 and the second color filter pattern 241.

Herein, the gap X3 of the first color filter pattern 232 between the bank pattern 140 or the black matrix 160 and the first color filter pattern 232 may be the same as the gap X3 of the third color filter pattern 233 between the bank pattern 140 or the black matrix 160 and the third color filter pattern 233, and the gap Y2 between the first color filter pattern 232 and the second color filter pattern 241 may be the same as the gap Y3 between the second color filter pattern 241 and the third color filter pattern 233.

Further, the gap Y2 between the first color filter pattern 232 and the second color filter pattern 241 and the gap Y3 between the second color filter pattern 241 and the third color filter pattern 233 may be at least two or more times greater than the gap X3 of the first color filter pattern 232 between the bank pattern 140 or the black matrix 160 and the first color filter pattern 232 and the gap X3 of the third color filter pattern 233 between the bank pattern 140 or the black matrix 160 and the third color filter pattern 233.

To be specific, the gap Y2 between the first color filter pattern 232 and the second color filter pattern 241 and the gap Y3 between the second color filter pattern 241 and the third color filter pattern 233 correspond to an overlay margin of two color filter patterns and thus may be greater than the gap X3 of the first color filter pattern 232 between the bank pattern 140 or the black matrix 160 and the first color filter pattern 232 and the gap X3 of the third color filter pattern 233 between the bank pattern 140 or the black matrix 160 and the third color filter pattern 233. For example, in FIG. 10, gap Y2 and the gap Y3 can both be greater than the gaps X3.

As described above, an organic light emitting diode display device according to the present embodiments includes at least one color filter pattern disposed corresponding to a white sub-pixel. Thus, although the organic light emitting diode display device does not use a polarizing plate, it is possible to reduce the reflectance and also possible to realize a clear black color. Further, in the organic light emitting diode display device according to the present embodiments, at least one color filter pattern disposed corresponding to the white sub-pixel is disposed to secure an overlay margin. Thus, it is possible to dispose the color filter pattern having a desired size at a desired location.

The features, structures, effects, etc. described in the above embodiments are included in at least one embodiment and but are not limited to one embodiment. In addition, the features, structures, effects, etc. described in the respective embodiments may be executed by those skilled in the art while being combined or modified with respect to other embodiments. Accordingly, it will be understood that contents related the combination and modification will be included in the scope of the present invention.

Further, it should be understood that the embodiments described above should be considered in a descriptive sense only and not for purposes of limitation. It will be understood by those skilled in the art that various other modifications and applications may be made therein without departing from the spirit and scope of the embodiments. For example, respective components shown in detail in the embodiments may be executed while being modified.

What is claimed is:

1. An organic light emitting diode display device comprising:
    a display panel including a plurality of pixels, at least one pixel among the plurality of pixels including a first sub-pixel, a second sub-pixel, a third sub-pixel and a fourth sub-pixel defined at intersection regions between a plurality of gate lines and a plurality of data lines; and
    a first color filter layer, a second color filter layer and a third color filter layer corresponding to the first sub-pixel, the third sub-pixel and the fourth sub-pixel, respectively,
    wherein the second sub-pixel includes:
        an emission area,
        a first color filter pattern disposed in the second sub-pixel for absorbing light incident from an outside of the organic light emitting diode display device, extending beyond opposite outer edges of the emission area, and disposed in parallel with the gate line, the first color filter pattern and the second sub-pixel corresponding to different colors, and
        a second color filter pattern disposed in the second sub-pixel for absorbing light incident from an outside of the organic light emitting diode display device, having an outer perimeter fully within the emission area, separated from the first color filter pattern, and disposed in parallel with the gate line, and
    wherein the first color filter pattern has a different color than the second color filter pattern.

2. The organic light emitting diode display device according to claim 1, wherein the second sub-pixel is a white sub-pixel and the first color filter pattern is a blue color filter pattern or a green color filter pattern.

3. The organic light emitting diode display device according to claim 1,
    further comprising:
    a reference voltage line disposed in parallel with the data line, and
    wherein the first color pattern is extended to a first gap between the outer edge of the emission area and the reference voltage line to secure an overlay margin.

4. The organic light emitting diode display device according to claim 1,
    wherein the second color filter pattern has a second gap between an edge of the second color filter pattern and a data line or a reference voltage line.

5. The organic light emitting diode display device according to claim 4 wherein the second color filter pattern has a third gap between the first color filter pattern and the second color filter pattern, and wherein the second color filter pattern has a fourth gap between an edge of the second color filter pattern and an edge of the emission area.

6. The organic light emitting diode display device according to claim 4, further comprising:

a third color filter pattern disposed in the second sub-pixel for absorbing light incident from an outside of the organic light emitting diode display device, wherein the third color filter pattern has a fourth gap between the second color filter pattern and the third color filter pattern, and wherein the third color filter pattern has a fifth gap between an edge of the emission area and the third color filter pattern.

7. The organic light emitting diode display device according to claim 6, wherein the third color filter pattern extends from the emission area to the data line or the reference voltage line.

8. The organic light emitting diode display device according to claim 6, wherein the first color filter pattern and the third color filter pattern are a same color.

9. The organic light emitting diode display device according to claim 8, wherein the first color filter pattern and the third color filter pattern are blue color filter patterns.

10. The organic light emitting diode display device according to claim 1, wherein the second color filter pattern is a blue color filter pattern or a green color filter pattern.

11. The organic light emitting diode display device according to claim 1, wherein the first color filter pattern or the second color filter pattern covers 10%-30% of the second sub-pixel.

12. The organic light emitting diode display device according to claim 1, wherein an area of the first color filter pattern is greater than an area of the second color filter pattern.

13. The organic light emitting diode display device according to claim 1, wherein an organic light emitting layer is disposed between a first electrode and a second electrode in the second sub-pixel, and the first electrode is connected to a thin film transistor, and wherein the emission area is defined by a bank pattern, the bank pattern corresponding to a non-emission area.

14. The organic light emitting diode display device according to claim 13, further comprising:

an overcoating layer disposed between the first color filter pattern and the first electrode; and a protective layer, wherein the first color filter pattern is disposed between the protective layer and the overcoating layer.

15. The organic light emitting diode display device according to claim 13, further comprising:

a black matrix disposed in a region corresponding to and overlapping with the bank pattern, wherein the organic light emitting layer is disposed between the black matrix and the first electrode and between first color filter pattern and the first electrode.

16. The organic light emitting diode display device according to claim 15, wherein the first electrode is a reflective electrode.

17. The organic light emitting diode display device according to claim 15, further comprising:

a second color filter pattern disposed in the second sub-pixel for absorbing light incident from an outside of the organic light emitting diode display device, wherein the first color filter pattern and the second color filter pattern are separated from each other with a greater distance than the first color filter pattern is separated from the bank pattern or the black matrix.

18. The organic light emitting diode display device according to claim 13, wherein the organic light emitting layer is disposed between the first color pattern and the second electrode.

19. The organic light emitting diode display device according to claim 18, wherein the second electrode is a reflective electrode.

20. An organic light emitting diode display device comprising:

a display panel including a plurality of pixels including at least one white sub-pixel disposed between two other sub-pixels, wherein the white sub-pixel includes:

an organic light emitting layer disposed between a first electrode and a second electrode, the first electrode connected to a thin film transistor, an emission area defined by a bank pattern, the bank pattern corresponding to a non-emission area, a first color filter pattern disposed in the white sub-pixel for absorbing light incident from an outside of the organic light emitting diode display device, having first two sides that extend beyond the emission area and second two sides that terminate over the emission area, and disposed in parallel with the gate line, the first color filter pattern having a different color than the white sub-pixel, a second color filter pattern disposed in the white sub-pixel for absorbing light incident from an outside of the organic light emitting diode display device, having an outer perimeter fully within the emission area, separated from the first color filter pattern, and disposed in parallel with the gate line, and wherein the first color filter pattern has a different color than the second color filter pattern.

* * * * *